United States Patent
Fischer et al.

(10) Patent No.: US 9,859,145 B2
(45) Date of Patent: Jan. 2, 2018

(54) COOLED PIN LIFTER PADDLE FOR SEMICONDUCTOR SUBSTRATE PROCESSING APPARATUS

(71) Applicant: Lam Research Corporation, Fremont, CA (US)

(72) Inventors: Andreas Fischer, Castro Valley, CA (US); Dean Larson, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 900 days.

(21) Appl. No.: 13/943,908

(22) Filed: Jul. 17, 2013

(65) Prior Publication Data

US 2015/0024594 A1  Jan. 22, 2015

(51) Int. Cl.
*H01L 21/00* (2006.01)
*H01L 21/687* (2006.01)
*H01J 37/32* (2006.01)
*H01L 21/67* (2006.01)

(52) U.S. Cl.
CPC .. *H01L 21/68742* (2013.01); *H01J 37/32715* (2013.01); *H01J 37/32724* (2013.01); *H01L 21/67109* (2013.01)

(58) Field of Classification Search
CPC ................................................ H01L 21/68742
USPC ........................................ 156/345.53–345.54
See application file for complete search history.

(56) References Cited

U.S. PATENT DOCUMENTS

| | | | |
|---|---|---|---|
| 5,948,704 A | | 9/1999 | Benjamin et al. |
| 5,968,273 A | * | 10/1999 | Kadomura ............... C23C 16/14 118/715 |
| 6,062,852 A | * | 5/2000 | Kawamoto ....... H01L 21/67109 392/418 |
| 6,129,546 A | * | 10/2000 | Sada ................. H01L 21/67109 118/725 |
| 6,352,050 B2 | | 3/2002 | Kamarehi et al. |
| 6,646,857 B2 | | 11/2003 | Anderson et al. |
| 6,647,993 B2 | | 11/2003 | Shang et al. |
| 6,669,783 B2 | | 12/2003 | Sexton et al. |
| 6,759,336 B1 | | 7/2004 | Chebi et al. |
| 7,244,311 B2 | | 7/2007 | Fischer |
| 7,811,409 B2 | | 10/2010 | Egley et al. |

(Continued)

FOREIGN PATENT DOCUMENTS

JP      2009038231 A  *  2/2009

*Primary Examiner* — Gordon R Baldwin
*Assistant Examiner* — Charlee Bennett

(57) ABSTRACT

A semiconductor substrate processing apparatus includes a cooled pin lifter paddle for raising and lowering a semiconductor substrate. The semiconductor substrate processing apparatus comprises a processing chamber in which the semiconductor substrate is processed, a heated pedestal for supporting the semiconductor substrate in the processing chamber, and the cooled pin lifter paddle located below the pedestal. The cooled pin lifter paddle includes a heat shield and at least one flow passage in an outer peripheral portion thereof through which a coolant can be circulated to remove heat absorbed by the heat shield of the cooled pin lifter paddle. The cooled pin lifter paddle is vertically movable such that lift pins on an upper surface of the heat shield travel through corresponding holes in the pedestal and a source of coolant is in flow communication with the at least one flow passage.

28 Claims, 5 Drawing Sheets

(56) References Cited

U.S. PATENT DOCUMENTS

| | | | |
|---|---|---|---|
| 7,993,460 B2 | 8/2011 | Steger | |
| 8,080,760 B2 | 12/2011 | Dhindsa et al. | |
| 8,110,045 B2 | 2/2012 | Yoneda et al. | |
| 8,232,538 B2 | 7/2012 | Sant et al. | |
| 8,274,017 B2 | 9/2012 | Yap et al. | |
| 8,282,987 B2 | 10/2012 | Kenworthy et al. | |
| 8,313,612 B2 * | 11/2012 | McMillin et al. | |
| 2003/0070915 A1* | 4/2003 | Kao | C23C 14/56 204/192.12 |
| 2003/0079691 A1* | 5/2003 | Shang | C23C 16/458 118/729 |
| 2003/0205328 A1* | 11/2003 | Kinnard | C23C 16/4411 156/345.37 |
| 2004/0187787 A1* | 9/2004 | Dawson | C23C 16/4586 118/728 |
| 2006/0240542 A1* | 10/2006 | Schieve | C23C 16/4582 435/287.2 |
| 2008/0035306 A1* | 2/2008 | White | C23C 16/4586 165/61 |
| 2009/0305489 A1* | 12/2009 | Fish | H01L 21/6831 438/514 |
| 2011/0033620 A1 | 2/2011 | Polyak et al. | |
| 2012/0070996 A1 | 3/2012 | Hao | |
| 2012/0090817 A1* | 4/2012 | Reid | G06F 1/20 165/80.2 |
| 2012/0161405 A1* | 6/2012 | Mohn | C23C 16/401 279/142 |
| 2012/0234243 A1 | 9/2012 | Olgado et al. | |

\* cited by examiner

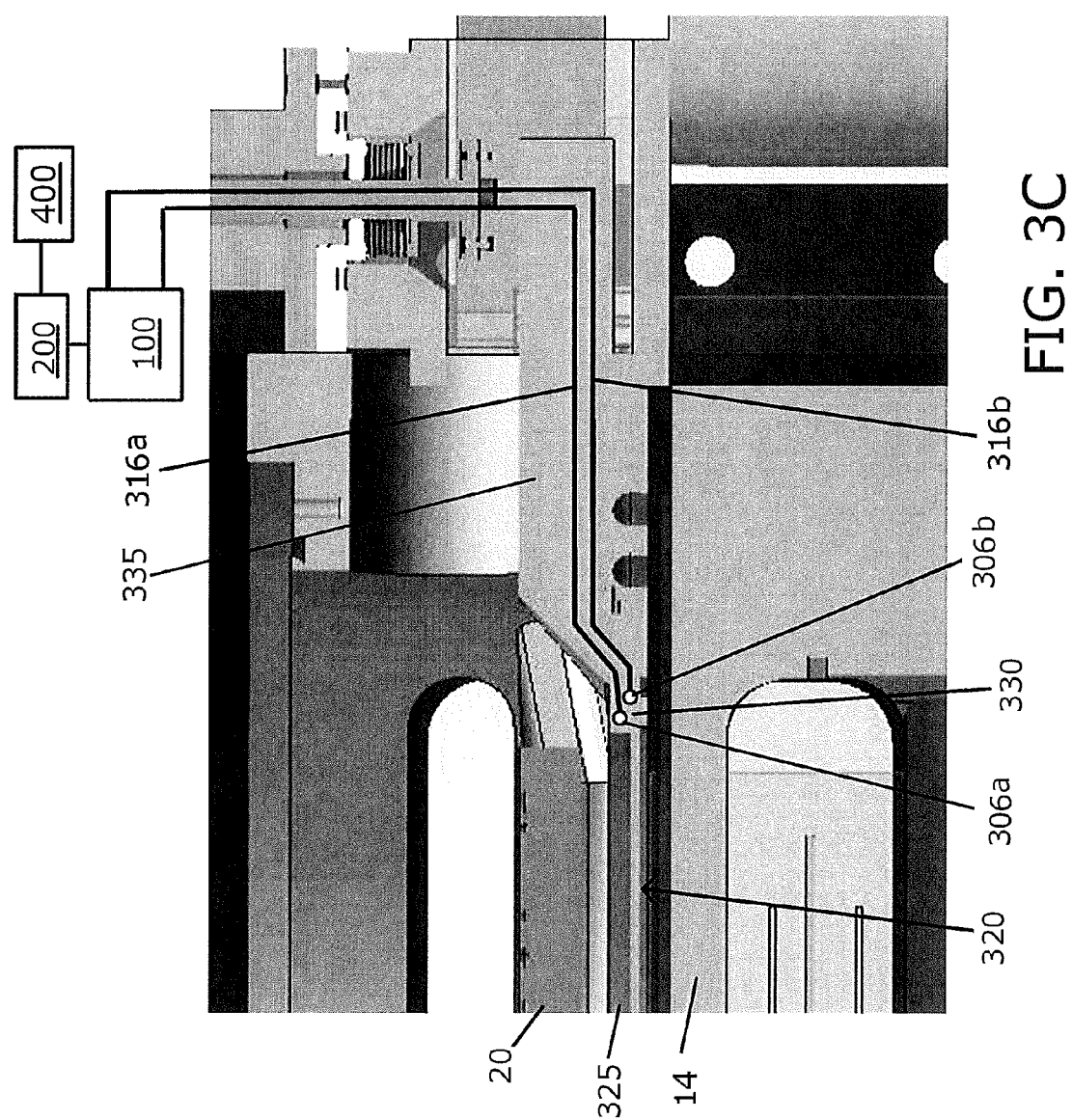

COOLED PIN LIFTER PADDLE FOR SEMICONDUCTOR SUBSTRATE PROCESSING APPARATUS

FIELD OF THE INVENTION

The present invention relates to semiconductor substrate processing apparatuses, and more specifically to a cooled pin lifter paddle of a semiconductor substrate processing apparatus.

BACKGROUND

Semiconductor substrate materials, such as silicon wafers, are processed by techniques including deposition processes, such as chemical vapor deposition (CVD) or plasma-enhanced chemical vapor deposition (PECVD) of metal, dielectric and semiconductor materials; etching processes; halogen-containing residue removal processes (i.e. degassing), and resist stripping processes.

Semiconductor integrated circuit (IC) processes include forming devices on substrates. Conductive and insulating material layers are deposited on the substrates. Resist can be applied as a masking layer over the layer stack and patterned to protect portions of the underlying material where etching is not desired. After the etch process has been completed, the resist is removed from the structure by a stripping technique, such as using organic strippers, oxidizing-type strippers, or dry stripping by plasma etching, and/or halogen containing residue which can accumulate on the semiconductor substrate during etching can be removed by a degassing technique in a degas chamber.

SUMMARY

Disclosed herein is a semiconductor substrate processing apparatus which includes a cooled pin lifter paddle for raising and lowering a semiconductor substrate. The semiconductor substrate processing apparatus comprises a processing chamber in which a semiconductor substrate is processed, a heated pedestal for supporting the semiconductor substrate in the processing chamber, and the cooled pin lifter paddle. The cooled pin lifter paddle is located below the pedestal wherein the cooled pin lifter paddle includes a heat shield and at least one flow passage in an outer peripheral portion thereof through which a coolant can be circulated to remove heat absorbed by the heat shield of the cooled pin lifter paddle wherein the cooled pin lifter paddle is vertically movable such that lift pins on an upper surface of the heat shield travel through corresponding holes in the pedestal to lift the substrate. A source of coolant is in flow communication with the at least one flow passage.

Also disclosed herein is a cooled pin lifter paddle which is configured to be located below a pedestal of a semiconductor substrate processing apparatus. The cooled pin lifter paddle comprises a heat shield and at least one flow passage in an outer peripheral portion thereof through which a coolant can be circulated to remove heat absorbed by the heat shield of the cooled pin lifter paddle wherein the cooled pin lifter paddle is vertically movable such that lift pins on an upper surface of the heat shield travel through corresponding holes in the pedestal to lift the substrate.

BRIEF DESCRIPTION OF THE DRAWING FIGURES

Figure 3A:
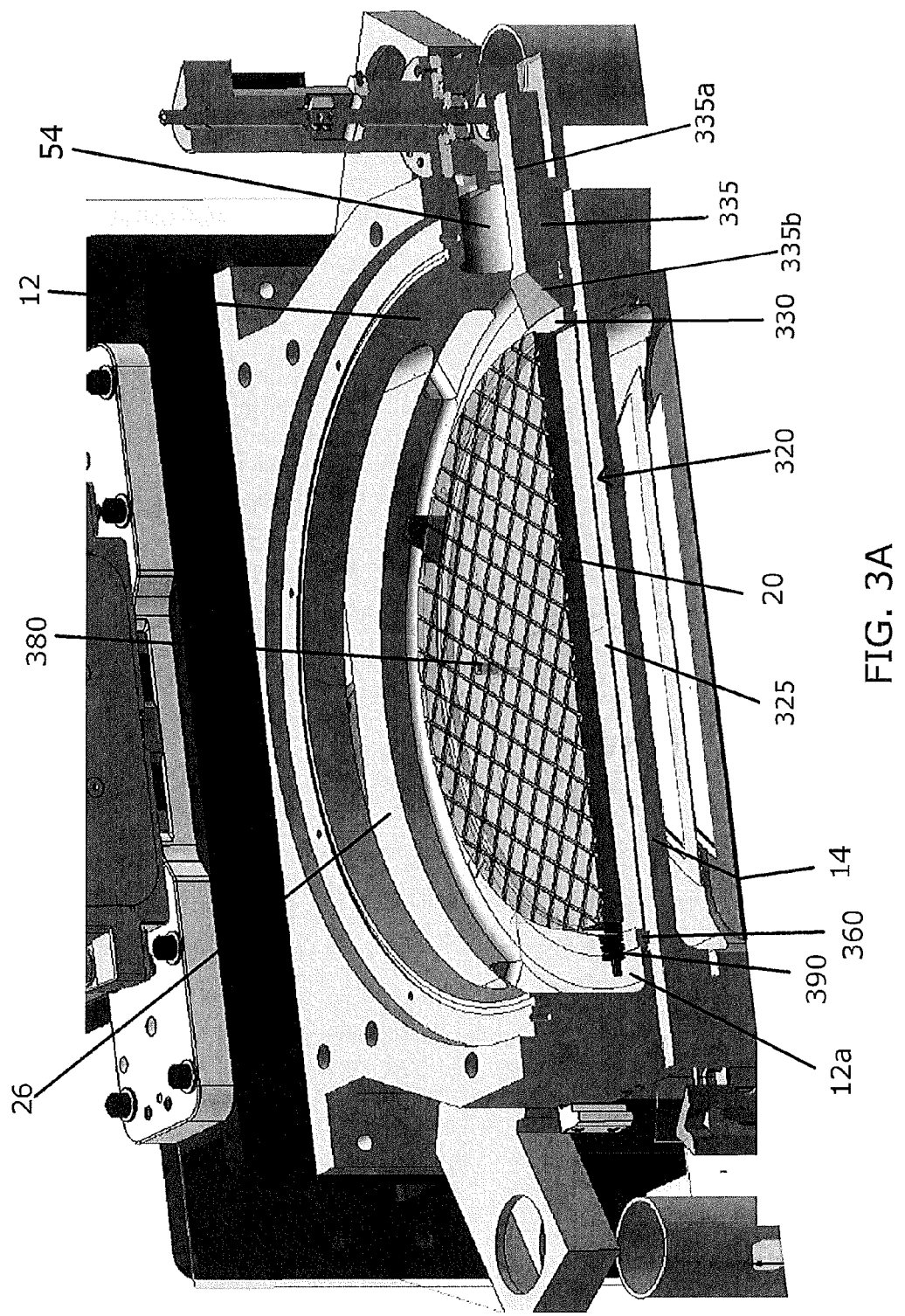
Figure 3B:
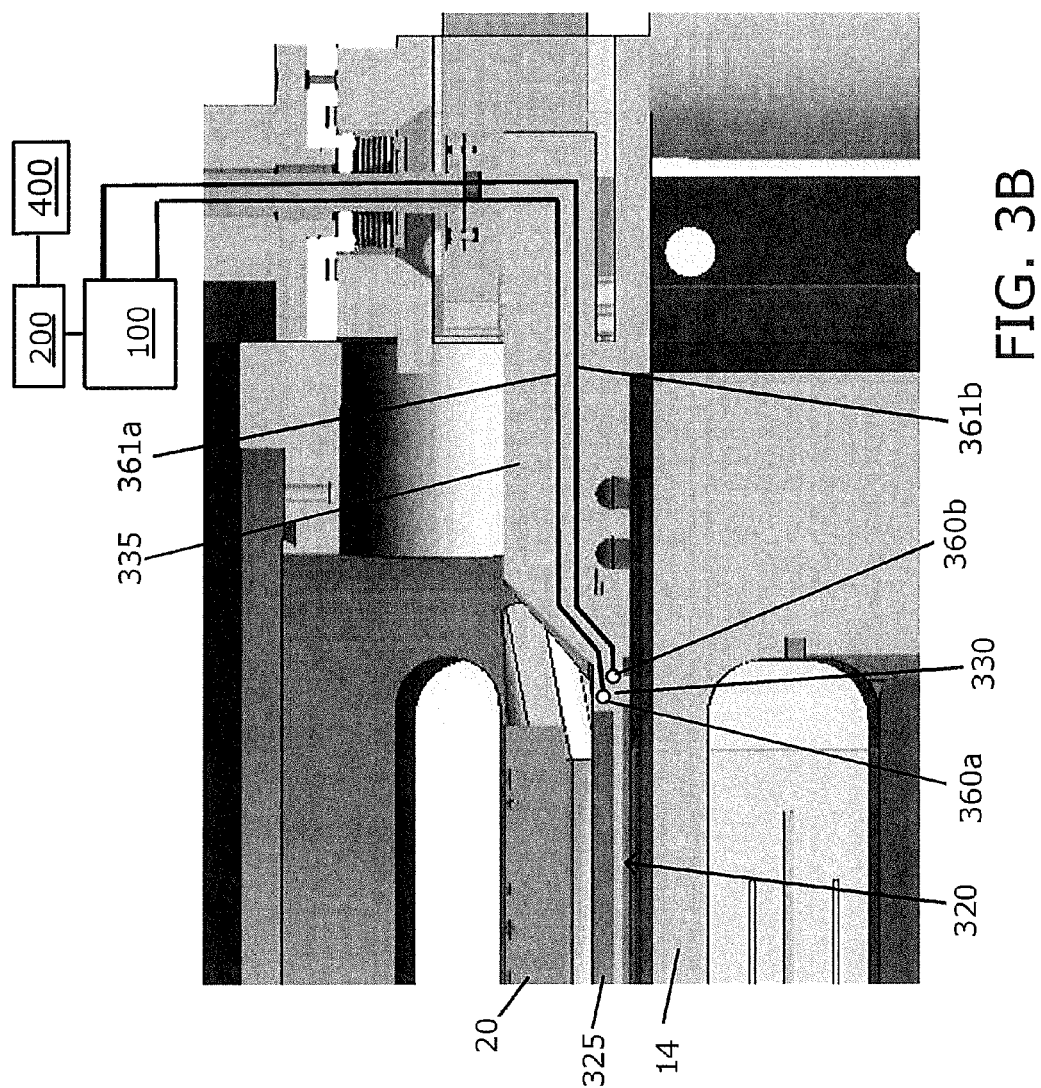

FIGS. 3A-C illustrate an embodiment of a pedestal and a cooled pin lifter paddle in accordance with embodiments disclosed herein.

DETAILED DESCRIPTION

In the following description, numerous specific details are set forth in order to provide a thorough understanding of embodiments described herein. However, it will be apparent to one skilled in the art that the embodiments described may be practiced without some of these specific details. In other instances, implementation details and process operations have not been described in detail, if already well known. Additionally, as used herein, the term "about" refers to ±10%.

During semiconductor substrate processing, walls of processing chambers can be cooled so that components adjacent to the walls do not absorb heat generated during processing. For example, a bottom wall of a semiconductor substrate processing chamber can include flow passages therein wherein a temperature controlled fluid can be circulated to absorb heat generated during processing such that an underlying component is not heated by the generated heat. However, including flow passages in the bottom wall of the chamber increases the overall height of the chamber. To reduce the height of semiconductor substrate processing chambers, a cooled pin lifter paddle can be located below a pedestal of the chamber wherein the cooled pin lifter paddle can shield heat from the pedestal to the bottom wall of the chamber. In this manner, flow passages in the bottom wall are not needed, and the thickness of the bottom wall can be reduced thereby reducing the height of the semiconductor substrate processing chamber.

Semiconductor substrate processing apparatuses for semiconductor substrates, such as silicon wafers, include semiconductor substrate processing chambers, which are used in semiconductor device manufacturing processes to deposit conductive or dielectric material on the substrate, etch metal or dielectric layers of the substrate, remove resist (or "photoresist") which is used as a mask for the semiconductor structures of the substrate, or remove halogen containing residues which formed on the substrate during etching processes.

During processing of a substrate (e.g., a semiconductor wafer, a flat panel display substrate, a dielectric material, or the like), such as a resist stripping process or degas process, the substrate is transferred into a semiconductor substrate processing chamber ("processing chamber") of a semiconductor substrate processing apparatus and loaded onto a pedestal. The processing chamber provides the process environment to perform processing wherein resist may be removed from the substrate by plasma etching or halogen-containing residues may be removed from the substrate by a degassing process. A substrate handling system which is part of the overall substrate processing apparatus is used to load and unload the substrate to and from the processing chamber wherein lift pins included on an upper surface of a cooled pin lifter paddle, which is below the pedestal, are configured to raise and lower the substrate to and from an upper surface of the pedestal in the processing chamber. The steps of inserting, processing, and removing the substrate may be repeated sequentially for a plurality of substrates.

Accordingly, in an embodiment, the lift pins are on an upper surface of a heat shield of a cooled pin lifter paddle, which is located below a pedestal, wherein the heat shield shields heat from the pedestal to a lower portion of a processing chamber. The cooled pin lifter paddle also includes at least one flow passage in an outer peripheral portion thereof through which a coolant can be circulated to remove heat absorbed by the heat shield wherein the heat shield is integral with the outer peripheral portion. The at least one flow passage of the cooled pin lifter paddle is in fluid communication with a coolant source operable to supply a coolant therethrough to remove heat absorbed by the heat shield, thereby cooling the cooled pin lifter paddle to a desired temperature. Dynamic temperature control of the surface of the pedestal can be enhanced by the combination of the heat shield having a low thermal mass and the coolant source having rapid response capabilities. Further, heat may be shielded from semiconductor substrate processing apparatus components below the heat shield. The coolant source preferably can also control selected parameters of the coolant, such as its temperature and/or flow rate.

Figure 1:
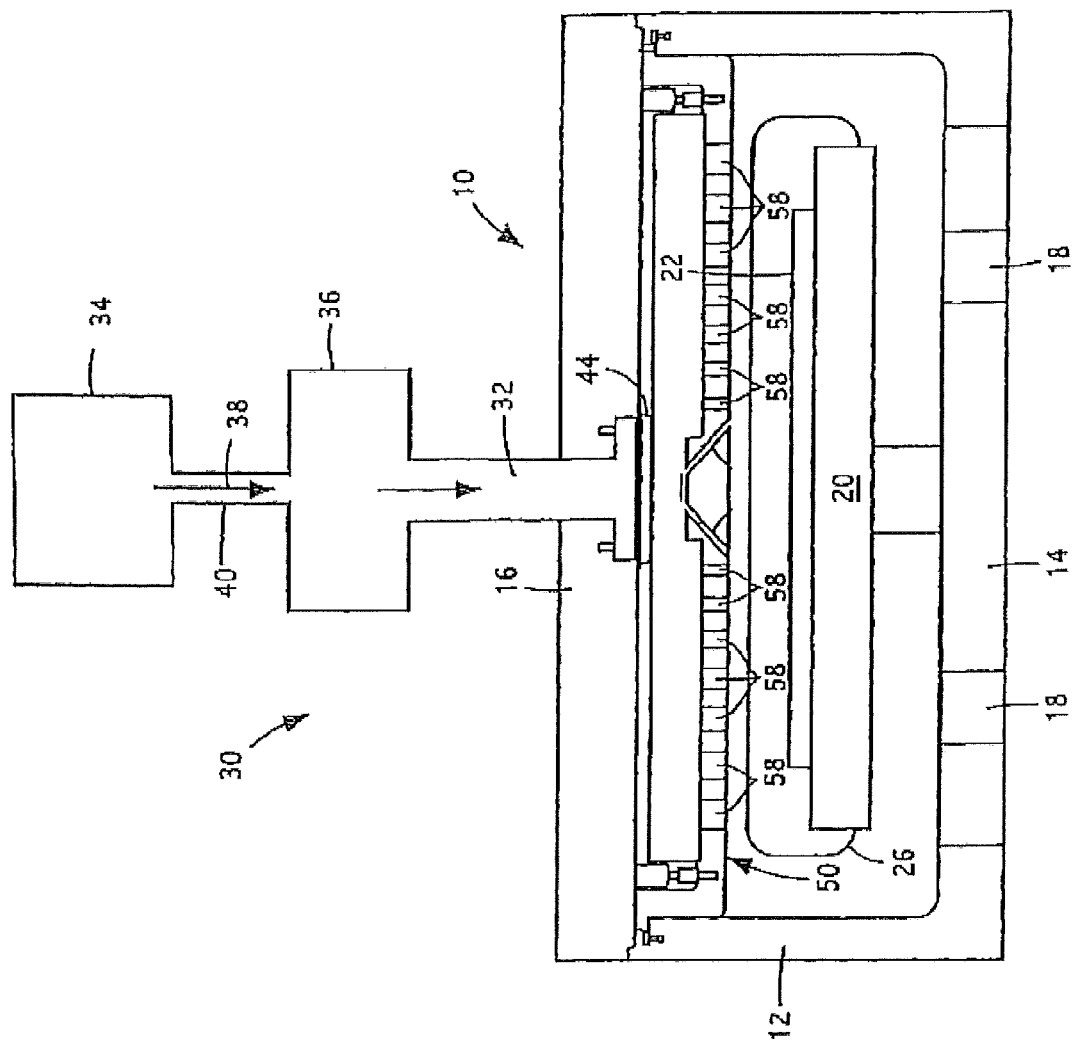
FIG. 1 depicts an embodiment of a resist stripping chamber.

FIG. 1 depicts an embodiment of a resist stripping chamber 10 in which can include a cooled pin lifter paddle according to embodiments disclosed herein. Additionally, embodiments of the cooled pin lifter paddle can be included in a degas chamber. An exemplary degas chamber can be found in commonly-assigned U.S. Pat. No. 8,232,538 which is incorporated by reference herein in its entirety.

The resist stripping chamber 10 includes a side wall 12, a bottom wall 14, and a cover 16. The walls 12, 14 and the cover 16 of the resist stripping chamber 10 can be of any suitable material, such as anodized aluminum, or bare aluminum. The cover 16 is preferably pivotably attached by hinges to the side wall 12 to allow the cover 16 to be opened to access the interior of the resist stripping chamber 10 to remove a baffle 50 for cleaning, replacement, or for other purposes. In an embodiment, the cover 16 can be lifted with a hoist. An exemplary baffle can be found in commonly-assigned U.S. Pat. No. 7,811,409 which is incorporated by reference herein in its entirety. The resist stripping chamber 10 can also include vacuum ports 18 in the bottom wall 14 or alternatively in the side wall 12.

The resist stripping chamber 10 also includes a pedestal 20 on which a semiconductor substrate 22, such as a wafer, rests or is mounted upon during resist stripping. The substrate 22 includes a resist that provides a masking layer for protecting underlying layers of the substrate 22 during a preceding etch or deposition process. The underlying layers can be of conductive, insulating and/or semiconductive materials. The pedestal 20 preferably includes a heater, such as a resistive heating element, adapted to maintain the substrate 22 at a suitable temperature during the resist stripping process, preferably from about 200° C. to about 300° C., more preferably from about 250° C. to about 300° C., and most preferably from about 280° C. to 300° C. The substrate 22 can be introduced into and removed from the resist stripping chamber 10 through a substrate entry port 26 provided in the sidewall 12.

In an embodiment, a remote plasma source 30 is arranged in fluid communication with the resist stripping chamber 10. The plasma source 30 is operable to produce plasma and to supply reactive species into the interior of the resist stripping chamber 10 through a passage 32 connected to the resist stripping chamber 10 such that resist can be removed from the substrate 22 supported on the pedestal 20. The illustrated embodiment of the plasma source 30 includes a remote energy source 36 and a stripping gas source 34. The energy source 36 can be any suitable source such as an RF generator or microwave generator.

The gas source 34 is operable to supply process gas, represented by arrow 38, into the passage 40, wherein the gas is energized into the plasma state by the microwave or RF energy produced by the energy source 36. Reactive species pass through an opening 44 into the interior of the resist stripping chamber 10.

The reactive species are distributed in the resist stripping chamber 10 by the baffle 50, which is preferably formed from aluminum, located between the cover 16 and the pedestal 20 before the reactive species flow onto the substrate 22 and strip the resist. The substrate 22 is preferably heated by a heater located in the pedestal 20 during resist stripping. Waste products generated during resist stripping are pumped out of the resist stripping chamber 10 through the vacuum ports 18.

Figure 2:
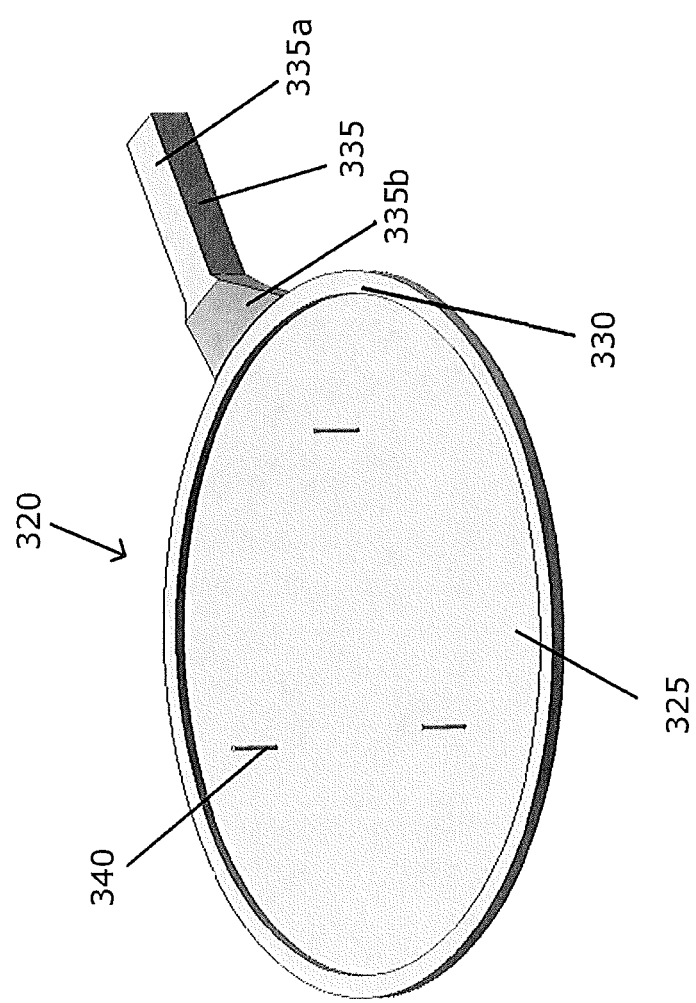
FIG. 2 illustrates an embodiment of a cooled pin lifter paddle in accordance with embodiments disclosed herein.

FIG. 2 illustrates a cooled pin lifter paddle 320 which can be located below a pedestal in a processing chamber of a semiconductor substrate processing apparatus in accordance with embodiments disclosed herein. The cooled pin lifter paddle 320 includes a heat shield 325 which shields heat from the pedestal to a lower portion of the processing chamber and at least one flow passage in an outer peripheral portion 330 of the cooled pin lifter paddle 320. The at least one flow passage in the outer peripheral portion 330 surrounds the heat shield 325. The cooled pin lifter paddle 325 can be formed from aluminum, an aluminum alloy, alumina, silicon carbide, or aluminum nitride, and in a preferred embodiment, the cooled pin lifter paddle 325 is of a cast aluminum or cast aluminum alloy. In an embodiment, a surface, such as an upper surface of the heat shield 325 of the cooled pin lifter paddle 320 is anodized.

The cooled pin lifter paddle 320 also preferably includes an arm 335 which is configured to be attached to a lift mechanism, such as a lift mechanism driven by a stepper motor or pneumatic actuator, wherein the arm 335 includes an inlet and outlet for each respective flow passage of the at least one flow passage in the outer peripheral portion 330 of the cooled pin lifter paddle 320. In a preferred embodiment, the cooled pin lifter paddle 320 includes first and second flow passages wherein coolant in the first flow passage flows in an opposite direction as coolant in the second flow passage such that heat is uniformly removed from the heat shield 325. The cooled pin lifter paddle 320 includes lift pins 340 on an upper surface of the heat shield 325 wherein tips of the lift pins 340 contact and raise a substrate off of the pedestal or lower the substrate onto the pedestal when the cooled pin lifter paddle 320 is respectively raised or lowered. The heat shield 325 is preferably a flat plate of uniform thickness wherein the outer peripheral portion 330 has a thickness which is greater than the flat plate. Preferably, the outer peripheral portion 330 forms an annular ring around the heat shield 325 wherein an inner diameter of the annular ring is larger than the pedestal 20. In a preferred embodiment, the arm 335 of the cooled pin lifter paddle 320 includes a horizontal portion 335a and an angled portion 335b. Preferably the arm 335 is integral with the heat shield 325 and outer peripheral portion 330 of the cooled pin lifter paddle 320 wherein the arm 335 is formed from a like material as the heat shield 325 and the outer peripheral portion 330, however in an alternate embodiment, the arm 335 can be formed from a different material than the heat shield 325 and the outer peripheral portion 330.

FIG. 3A illustrates an embodiment of a pedestal 20 and cooled pin lifter paddle 320 of a processing chamber, such as a resist stripping chamber or a degas chamber, wherein a cooled pin lifter paddle 320 is located below the pedestal 20 which is heated. The pedestal 20 is preferably supported by flexures 390 which attach the pedestal 20 to an annular flange 12*a* of the side wall 12. Each flexure 390 includes turns therein, such that they may accommodate thermal expansion of the pedestal 20 during semiconductor substrate processing (e.g. a resist stripping processes or a degas process). In a preferred embodiment, each flexure includes at least four turns. Preferably each flexure is formed from aluminum or an aluminum alloy, and can optionally act to ground the pedestal 20 to the side wall 12.

An arm 335 of the cooled pin lifter paddle 320 extends horizontally through an opening 54 of the side wall 12 of the chamber. To process a substrate, the substrate is loaded into the chamber, and placed on an upper surface of the pedestal 20 wherein the cooled pin lifter paddle 320 is vertically movable such that lift pins on an upper surface thereof travel through corresponding holes 380 in the pedestal 20 to raise and lower the substrate to and from the upper surface of the pedestal 20. Preferably, the arm 335 of the cooled pin lifter paddle 320 includes a horizontal portion 335*a* and an angled portion 335*b*. In an embodiment, a robot arm (not shown) can transport a substrate through a substrate entry port 26 into the processing chamber. The cooled pin lifter paddle 320 including the lift pins on an upper surface thereof can be raised and lowered by a lift mechanism 400. Preferably the lift mechanism is a pneumatic actuator. An exemplary pneumatic actuator can be found in commonly-assigned U.S. Pat. No. 8,313,612 which is incorporated by reference herein in its entirety.

The robot arm can locate the substrate above tips of respective lift pins wherein the cooled pin lifter paddle 320 can be raised to remove the substrate from the robot arm and lowered such that the substrate is placed on an upper surface of the pedestal 20. After processing the substrate, the cooled pin lifter paddle 320 can be raised such that the lift pins lift the substrate off of the upper surface of the pedestal 20, allowing the substrate to be transferred to the robot arm and removed from the processing chamber via the robotic arm.

The pedestal 20 is preferably heated wherein the pedestal 20 can include at least one heater, such as a resistive heating element embedded therein, adapted to maintain the substrate at a suitable temperature during the resist stripping process. The cooled pin lifter paddle 320 includes a heat shield 325 which shields heat from the pedestal 20 to chamber components below the heat shield 325. The diameter of the heat shield 325 is preferably greater than the diameter of the pedestal 20 wherein an outer peripheral portion 330 of the cooled pin lifter paddle 320 which surrounds the heat shield 325, surrounds the pedestal 20 when the cooled pin lifter paddle 320 is in an up position. For example, the inner diameter of the outer peripheral portion 330 can be greater than the diameter of the pedestal 20. At least one annular flow passage 360 is included in the outer peripheral portion 330 wherein a coolant is flowed through the at least one flow passage 360 such that heat collected (absorbed) by the heat shield 325 may be removed from the cooled pin lifter paddle 320. Preferably the coolant circulated through the at least one flow passage is at a temperature of about −40° to 40° C., and more preferably at a temperature of about 20° C.

The cooled pin lifter paddle 320 preferably shields heat from the bottom wall 14 of the chamber such that flow passages in the bottom wall 14 which are used to cool the bottom wall 14 can be omitted, and the thickness of the bottom wall 14 can be reduced thereby reducing the height of the processing chamber.

As illustrated in FIG. 3B, first and second supply lines 361*a,b* which extend through the arm 335 of the cooled pin lifter paddle 320 can supply coolant from a coolant supply 100 to respective first and second inlets 360*a,b* of two respective flow passages in the outer peripheral portion 330 of the cooled pin lifter paddle 320. The coolant supplied to the first and second inlets 360*a,b* is circulated through each flow passage in the outer peripheral portion 330, which surrounds the heat shield 325, of the cooled pin lifter paddle 320 and is removed from the outer peripheral portion 330 of the cooled pin lifter paddle 320 through corresponding first and second outlets 306*a,b* (see FIG. 3C) wherein the coolant is returned to the coolant supply 100 through respective first and second return lines 316*a,b* (see FIG. 3C). The coolant circulated through the outer peripheral portion 330 of the cooled pin lifter paddle 320 can remove heat absorbed by the heat shield 325 that was generated during semiconductor substrate processing. The absorbed heat may be removed from the heat shield 325 such that the cooled pin lifter paddle 320 shields underlying chamber components and the bottom wall 14 from heat generated by the pedestal 20 during processing and plasma struck above the pedestal 20 in a resist stripping process or heat radiated from UV lamps above the pedestal 20 in a degassing process. In a preferred embodiment, coolant is circulated through the two flow passages in the outer peripheral portion 330 of the cooled pin lifter paddle 320 wherein the coolant is circulated through each flow passage in an opposite direction, such that the cooled pin lifter paddle 320 is uniformly cooled. The operation of the coolant source 100 is preferably controlled by a control system 200 in control communication with the coolant source 100.

The cooled pin lifter paddle 320 can further be operated under the control of the control system 200 which monitors the position of the cooled pin lifter paddle 320 and directs the cooled pin lifter paddle 320 to be raised or lowered by the lifting mechanism 400, such as a pneumatic actuator or a stepper motor. The control system 200 can also be employed to control process conditions during other process operations, such as resist stripping or degassing. The control system 200 will typically include one or more memory devices and one or more processors. The processor may include a CPU or computer, analog and/or digital input/output connections, stepper motor controller boards, etc.

In certain embodiments, the control system 200 controls all of the activities of the semiconductor substrate processing apparatus. The control system 200 can execute system control software including sets of instructions for controlling the timing of the processing operations, frequency and power of operations of the remote plasma source, flow rates and temperatures of process gases and their relative mixing, temperature of the pedestal 20, pressure of the chamber, and other parameters of any particular process. For example, the control system is operable to control the volumetric flow rate and/or the temperature of the coolant circulated through the at least one flow passage, so as to control cooling of the heat shield 325 of the cooled pin lifter paddle 320. Other computer programs stored on memory devices associated with the control system may be employed in some embodiments.

Typically there will be a user interface associated with control system 200. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The control system parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the control system. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure control of the chamber.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A semiconductor substrate processing apparatus, comprising:
   a processing chamber in which a semiconductor substrate is processed;
   a heated pedestal for supporting the semiconductor substrate in the processing chamber, wherein the heated pedestal has a bottom surface, and wherein the bottom surface has a first surface area;
   a cooled pin lifter paddle located below the heated pedestal, wherein the cooled pin lifter paddle comprises a heat shield, wherein the heat shield has a top surface and an outer peripheral portion, wherein the top surface has a second surface area and faces the bottom surface of the heated pedestal, wherein the second surface area is greater than or equal to the first surface area, wherein the outer peripheral portion comprises at least one channel, wherein the at least one channel of the outer peripheral portion extends along a circumference of the heat shield, and wherein a coolant is circulated in the at least one channel of the outer peripheral portion to remove heat absorbed by the heat shield,
   wherein the cooled pin lifter paddle is vertically movable such that lift pins on an upper surface of the heat shield travel through corresponding holes in the heated pedestal to raise and lower the semiconductor substrate,
   wherein the cooled pin lifter paddle includes an arm, wherein the arm extends outwardly from the outer peripheral portion of the cooled pin lifter paddle, wherein the arm comprises an inlet and an outlet, which are in fluid communication with the at least one channel of the outer peripheral portion, and wherein the arm comprises a plurality of channels, which are in fluid communication with the at least one channel of the outer peripheral portion of the outer peripheral portion of the cooled pin lifter paddle;
   and a source of the coolant, wherein the source is in fluid communication with the at least one channel.

2. The semiconductor substrate processing apparatus of claim 1, wherein the processing chamber is:
   (a) a resist stripping chamber which includes a remote plasma source operable to generate a plasma and introduce reactive species into the resist stripping chamber;
   (b) a degas chamber which is operable to remove halogen-containing residues from the semiconductor substrate;
   (c) a plasma etching chamber which is operable to etch a metal or dielectric layer of the semiconductor substrate; or
   (d) a plasma deposition chamber which is operable to deposit a conductive or dielectric material on the semiconductor substrate.

3. The semiconductor substrate processing apparatus of claim 1, wherein:
   (a) a center portion of the heat shield is a flat plate;
   (b) a thickness of the outer peripheral portion is greater than a thickness of the flat plate;
   (c) three lift pins are implemented on the top surface of the heat shield;
   (d) the outer peripheral portion and the center portion are integrally formed as a single element;
   (e) the outer peripheral portion forms an annular ring around the center portion; and
   (f) an inner diameter of the annular ring is greater than a diameter of the heated pedestal.

4. The semiconductor substrate processing apparatus of claim 1, wherein:
   the arm comprises a horizontal section and an angled section; and
   the arm is formed from a different material than the heat shield.

5. The semiconductor substrate processing apparatus of claim 4, further comprising a lift mechanism attached to the arm, wherein the lift mechanism is operable to vertically raise and lower the cooled pin lifter paddle.

6. The semiconductor substrate processing apparatus of claim 1, including:
   (a) a control system configured to control processes performed by the processing apparatus; and
   (b) a non-transitory computer machine-readable medium comprising program instructions for control of the processing apparatus.

7. The semiconductor substrate processing apparatus of claim 6, wherein the control system is operable to control:
   (a) a volumetric flow rate of the coolant circulated through the at least one channel;
   (b) a temperature of the coolant circulated through the at least one channel; and
   (c) a direction at which the coolant is circulated through the at least one channel.

8. The semiconductor substrate processing apparatus of claim 1, wherein the cooled pin lifter paddle is formed from a metallic material or a ceramic material.

9. The semiconductor substrate processing apparatus of claim 1, wherein the cooled pin lifter paddle is formed from aluminum, aluminum alloy, alumina, cast aluminum, a cast aluminum alloy, silicon carbide, or aluminum nitride.

10. The semiconductor substrate processing apparatus of claim 9, wherein the top surface of the cooled pin lifter paddle is anodized.

11. The semiconductor substrate processing apparatus of claim 1, wherein the cooled pin lifter paddle includes two channels in the outer peripheral portion.

12. A pin lifter paddle configured to be located below a pedestal of a semiconductor substrate processing apparatus, the pin lifter paddle comprising:
   a heat shield having a center portion and a top surface, wherein the top surface has a second surface area and faces a bottom surface of the pedestal when installed in the semiconductor substrate processing apparatus, and wherein the second surface area is greater than or equal to a first surface area of the bottom surface of the pedestal;
   an outer peripheral portion that surrounds the center portion;
   at least one channel that extends around a circumference of the heat shield and is located in the outer peripheral portion, wherein a coolant is circulated in the at least one channel in the outer peripheral portion to remove heat absorbed by the heat shield,
   wherein the pin lifter paddle is configured to be vertically movable, to lift pins on an upper surface of the heat shield, and wherein the pins are disposed on the heat shield to match a spaced arrangement of corresponding holes in the pedestal:
   an arm, wherein the arm extends outwardly from the outer peripheral portion of the pin lifter paddle, wherein the arm comprises an inlet and an outlet, which are in fluid communication with the at least one channel in the outer peripheral portion, and wherein the arm comprises a plurality of channels, which are in fluid communication with the at least one channel in the outer peripheral portion of the pin lifter paddle.

13. The pin lifter paddle of claim 12, wherein:
   (a) the center portion is a flat plate;
   (b) a thickness of the outer peripheral portion is greater than a thickness of the flat plate;
   (d) three lift pins are implemented on an upper surface of the heat shield;
   (e) the outer peripheral portion and the center portion are integrally formed as a single element;
   (f) the outer peripheral portion forms an annular ring around the center portion; and
   (g) an inner diameter of the annular ring is greater than a diameter of the pedestal.

14. The pin lifter paddle of claim 12, wherein:
   the arm comprises a horizontal section and an angled section; and
   the arm is formed from a different material than the heat shield.

15. The pin lifter paddle of claim 12, wherein the pin lifter paddle is formed from a metallic material or ceramic material.

16. The pin lifter paddle of claim 12, wherein the pin lifter paddle is formed from aluminum, aluminum alloy, alumina, cast aluminum, cast aluminum alloy, silicon carbide, or aluminum nitride.

17. The pin lifter paddle of claim 16, wherein the top surface of the pin lifter paddle is anodized.

18. The pin lifter paddle of claim 12, wherein the pin lifter paddle includes two channels in the outer peripheral portion.

19. A method of processing the semiconductor substrate in the semiconductor substrate processing apparatus of claim 1, the method comprising:
   loading the semiconductor substrate onto lift pins of the cooled pin lifter paddle;
   lowering the cooled pin lifter paddle such that the semiconductor substrate is supported on the top surface of the heated pedestal;
   processing the semiconductor substrate; and
   unloading the semiconductor substrate from the surface of the heated pedestal by raising the cooled pin lifter paddle.

20. The semiconductor substrate processing apparatus of claim 1, wherein: the at least one channel of the outer peripheral portion includes a first channel and a second channel; and coolant in the first channel flows in an opposite direction as coolant in the second channel.

21. The semiconductor substrate processing apparatus of claim 1, wherein the cooled pin lifter paddle is disposed between the heated pedestal and a bottom wall of the processing chamber.

22. The semiconductor substrate processing apparatus of claim 1, wherein:
   the heat shield comprises a center portion that is implemented as a plate; and
   the at least one channel is enclosed within the outer peripheral portion and is connected to and extends around a peripheral edge of the center portion.

23. The semiconductor substrate processing apparatus of claim 22, wherein the peripheral portion is thicker than the center portion.

24. The semiconductor substrate processing apparatus of claim 22, wherein:
   the center portion is circular-shaped; and
   the peripheral portion is arranged as an annular ring around the center portion.

25. The semiconductor substrate processing apparatus of claim 1, wherein a diameter of the heat shield is greater than or equal to a diameter of the heated pedestal.

26. The semiconductor substrate processing apparatus of claim 1, wherein the cooled pin lifter paddle comprises an arm that is connected to the heat shield and is formed of a different material than the heat shield.

27. The semiconductor substrate processing apparatus of claim 1, further comprising a baffle disposed above the heated pedestal and on an opposite side of the heated pedestal as the cooled pin lifter paddle, wherein the baffle distributes a reactive species in the processing chamber.

28. A system comprising:
   the pin lifter paddle of claim 12; and
   the pedestal,
   wherein the pin lifter paddle is vertically movable, such that the lift pins on the upper surface of the heat shield travel through the holes in the pedestal.

* * * * *